(12) United States Patent
Hsieh

(10) Patent No.: US 7,629,634 B2
(45) Date of Patent: Dec. 8, 2009

(54) TRENCHED MOSFET WITH TRENCHED SOURCE CONTACT

(75) Inventor: Fu-Yuan Hsieh, HsinChu (TW)

(73) Assignee: Force MOS Technology Co., Ltd., Hsinchu (TW)

( * ) Notice: Subject to any disclaimer, the term of this patent is extended or adjusted under 35 U.S.C. 154(b) by 96 days.

(21) Appl. No.: 12/036,243

(22) Filed: Feb. 23, 2008

(65) Prior Publication Data

US 2009/0212359 A1   Aug. 27, 2009

(51) Int. Cl.
   *H01L 29/76* (2006.01)
   *H01L 31/062* (2006.01)
   *H01L 31/113* (2006.01)

(52) U.S. Cl. ............... 257/288; 257/330; 257/E21.41; 257/E29.262

(58) Field of Classification Search ............... 257/288, 257/330, E21.41, E29.262
See application file for complete search history.

(56) References Cited

U.S. PATENT DOCUMENTS 6,888,196 B2 * 5/2005 Kobayashi .................. 257/330

* cited by examiner

*Primary Examiner*—David S Blum
(74) *Attorney, Agent, or Firm*—Grace Lee Huang; Arch Equity Holding LLC

(57) ABSTRACT

A trenched MOSFET with trenched source contact, comprising: a semiconductor region, further comprising a silicon substrate, a epitaxial layer corresponding to the drain region of the trenched MOSFET, a base layer corresponding to the body region of the trenched MOSFET, and a source layer corresponding to the source region of the trenched MOSFET; an interlayer oxide film formed on the source layer; a front metal layer formed on a upper surface of the semiconductor region; a back metal layer formed on a lower surface of the semiconductor region; a plurality of trenched gates formed to reach the epitaxial layer through the source layer and the base layer, and is covered by the interlayer oxide film; and a plurality of source contact trenches formed to reach the base layer through the interlayer oxide film and the source layer, and is covered by the front metal layer; wherein the silicon substrate, the epitaxial layer, the base layer, and the source layer are stacked in sequence; and each of the source contact trenches has a lateral contact layer at a sidewall thereof.

9 Claims, 10 Drawing Sheets

TRENCHED MOSFET WITH TRENCHED SOURCE CONTACT

FIELD OF THE INVENTION

This invention relates to a trenched MOSFET with trenched source contact and, in particular, to provide a lateral contact layer in the MOSFET for avalanche improvement.

BACKGROUND OF THE INVENTION

In the structure of a trench Metal-Oxide-Semiconductor Field Effect Transistor (MOSFET) or vertical transistor, the gate of the transistor is formed in a trench on top of an epitaxial layer—and the source/drain regions are formed on both sides of the gate. This type of vertical transistor allows high current to pass through and channel to be turned on/off at a low voltage.

Referring to FIG. 1, a cross-sectional diagram of the structure of a trenched MOSFET is shown. In the prior art, the trenched MOSFET has a MOSFET structure comprises a $N^+$-type silicon substrate (101), a N-type epitaxial layer (102), a plurality of trenches (121), an oxide film (122), a polysilicon (123), a plurality of gate oxide films (103), a plurality of trenched gates (104), a P-type base layer (105), a $N^+$-type source layer (106), an interlayer oxide film (107), a plurality of source contact trenches (124), a $P^+$-type base contact layer (108), a barrier metal layer (110), a plurality of contact metal plugs (111), a front metal layer (112), and a rear metal layer (113). The $N^+$-type silicon substrate (101), the N-type epitaxial layer (102), the P-type base layer (105), and the $N^+$-type source layer (106) are stacked in sequence; and each of the source contact trenches (124) has a $P^+$-type base contact layer (108) at a bottom thereof. However, the $P^+$-type region of prior art is located only at source contact trench bottom. The sidewall of source contact trench has no ohmic contact (due to low doping concentration of P base) with the contact metal plug resulting in poor ruggedness performance during UIS (Unclamp Inductance Switching) test. A parasitic N+/P/N is easily turned on when P base resistance from channel to the contact metal plug is high enough, causing device destroyed.

The present invention provides a new structure of trenched MOSFET structure with a trenched source contact which improves the lack of the prior art.

SUMMARY OF THE INVENTION

The present invention is to provide a trenched MOSFET (Metal-Oxide-Semiconductor Field Effect Transistor) with trenched source contact, comprising: a semiconductor region, further comprising a silicon substrate, a epitaxial layer corresponding to the drain region of the trenched MOSFET, a base layer corresponding to the body region of the trenched MOSFET, and a source layer corresponding to the source region of the trenched MOSFET; an interlayer oxide film formed on the source layer; a front metal layer formed on a upper surface of the semiconductor region; a back metal layer formed on a lower surface of the semiconductor region; a plurality of trenched gates formed to reach the epitaxial layer through the source layer and the base layer, and is covered by the interlayer oxide film; and a plurality of source contact trenches formed to reach the base layer through the interlayer oxide film and the source layer, and is covered by the front metal layer; wherein the silicon substrate, the epitaxial layer, the base layer, and the source layer are stacked in sequence; and each of the source contact trenches has a lateral contact layer at a sidewall thereof.

According to the present invention, the silicon substrate, the epitaxial layer, and the source layer are N-type; the base layer and lateral contact layer P* are P-type; and each of the source contact trenches further has a $P^+$-type base contact layer at a bottom thereof and the lateral contact layer P* has less doping concentration than the $P^+$ base contact layer at the source contact trench but higher doping concentration than P-base layer to achieve ohmic contact between the P*-type region, which is lower doping concentration than $P^+$-type region, and the contact metal plug while threshold voltage Vth is not significantly affected by P*-type region.

Moreover, the trenched MOSFET further comprises a barrier metal layer and a plurality of contact metal plugs. The barrier metal layer is Ti/TiN or Co/TiN and the contact metal plug is Tungsten.

In the said above, the description has been directed to the N-channel MOSFET structure. However, by inverting the conductive type, this invention is also applicable to a P-channel MOSFET structure. Moreover, in the MOSFET of this invention, the source contact trenches of the MOSFET are not restricted to have vertical shape but may be a sloped shape respective to the surface of epitaxial layer.

Compared with the conventional trenched MOSFET, the present invention provides good ohmic contact to sidewall of the source contact and the base resistance Rp between channel and the source contact trench is thus reduced. Otherwise, the parasitic vertical bipolar ($N^+$-P-N bipolar, $N^+$ is the $N^+$-type source layer, P is the P-type base layer, N is the N-type epitaxial layer) will be turned on when the avalanche current (Iav) product the resistance (Rp) underneath $N^+$-type source layer between the trenched gate and the trenched contact is equal to 0.7V. A feature of the description above is that the Iav is higher as the Rp is lower.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Referring to FIGS. 2A to 2F, description will be made of a method of producing a trenched MOSFET with trenched source contact according to an embodiment of the present invention.

Figure 1:
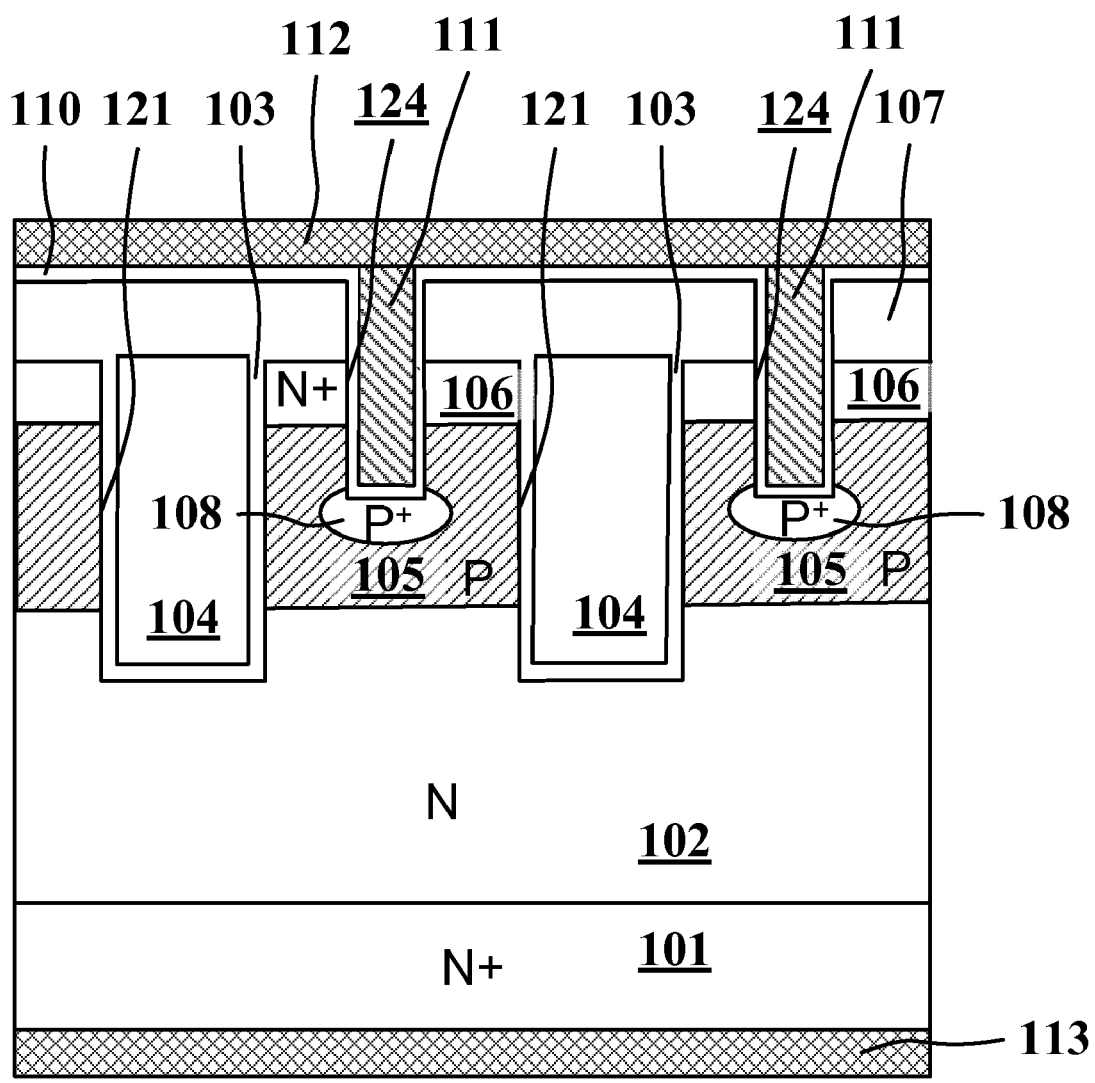
FIG. 1 is a sectional view of a conventional vertical trenched MOSFET.
Figure 2A:
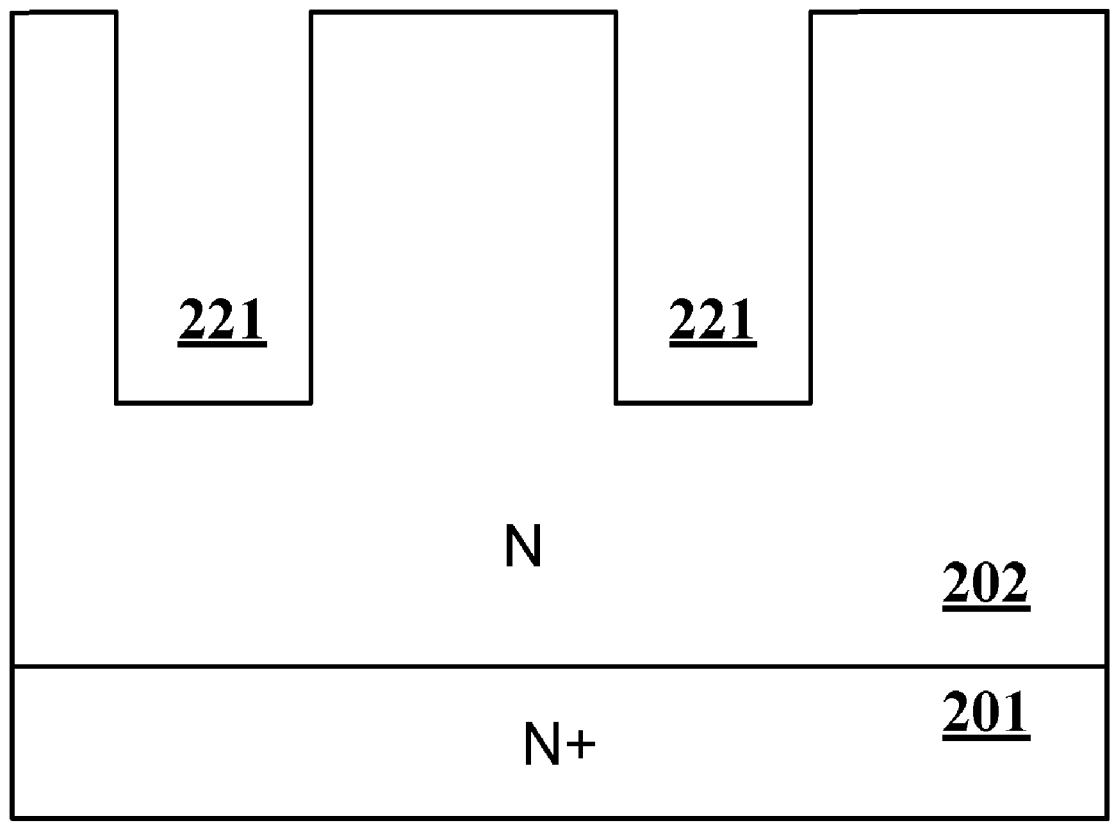
FIGS. 2A to 2G are sectional views for describing the processes in accordance with a embodiment of the present invention.

Referring to FIG. 2A, a silicon substrate comprises a N+-type silicon substrate (201) which is strongly n-doped and has a N-type epitaxial layer (202) which is weakly n-doped thereon. A trench mask, a sacrificial oxide (not showed in figure), is applied, and Lithography and silicon etching processes are performed to form a plurality of gate trench (221) in the N-type epitaxial layer (202). Thereafter, the trench mask, sacrificial oxide is removed by wet etching. The depth and the width of each gate trench (221) and the distance between the adjacent gate trenches (221) must be selected to optimum sizes because the breakdown voltage and the on-resistance characteristic of the MOSFET depend thereupon. However, these sizes are also related to the state of formation of an impurity diffusion layer and have some degrees of freedom.

Figure 2B:
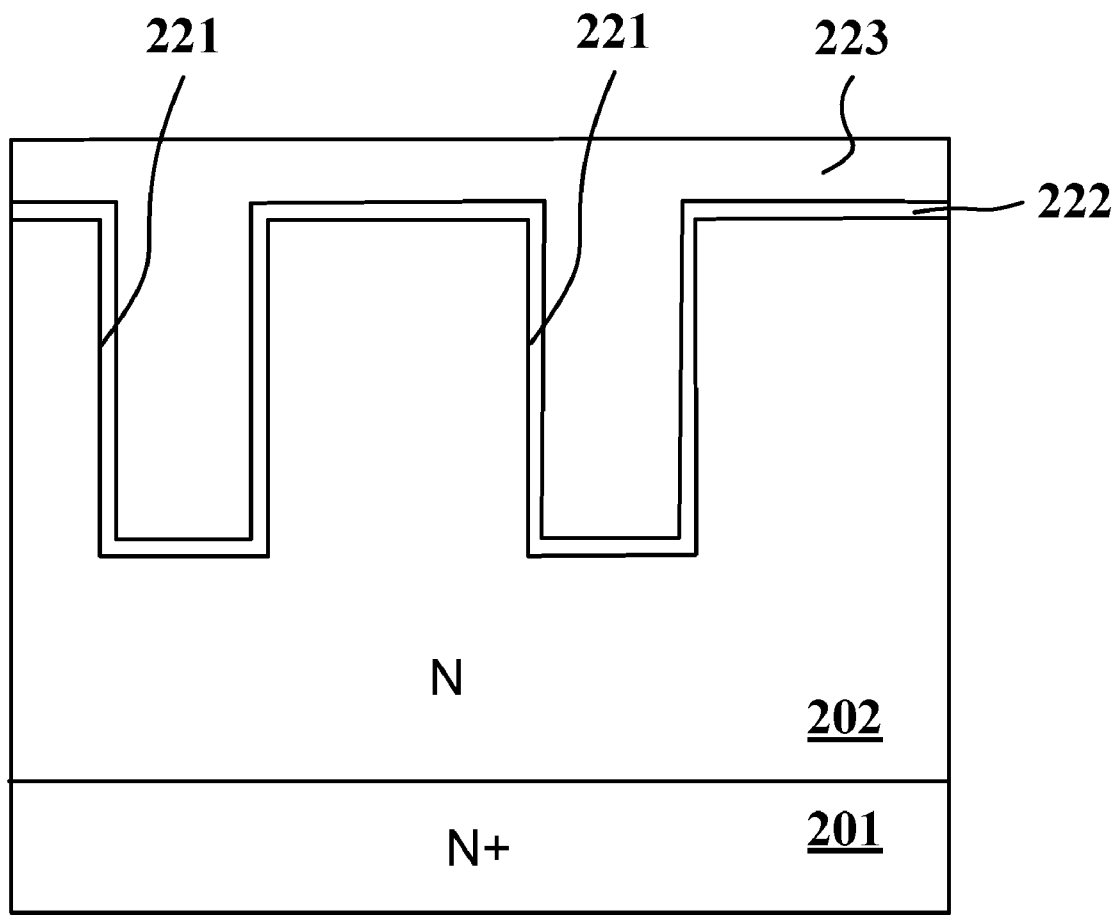

Referring to FIG. 2B, a deposition or thermally grown process is performed to form an oxide film (222) on the surface of the N-type epitaxial layer (202) and on inner surfaces of the gate trenches (221). Thereafter, a heavily doped polysilicon (223) is deposited by CVD procedure. In order to sufficiently fill the gate trenches (221) with the polysilicon (223), the thickness of the polysilicon (223) must be equal to or greater than half of an aperture width of the gate trenches (221). The polysilicon (223) preferably has a low resistance because it is used as a gate electrode.

Figure 2C:
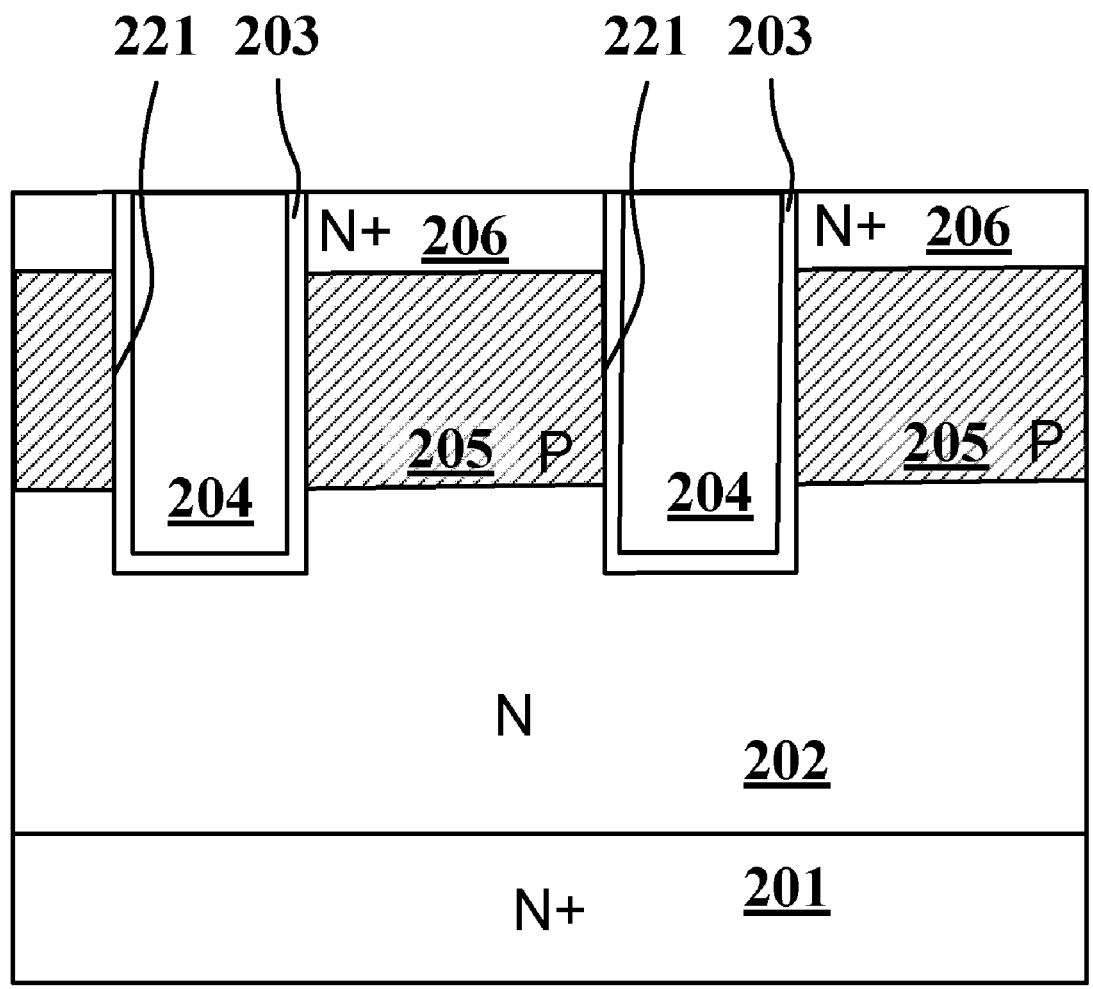

Referring to FIG. 2C, the oxide film (222) and the polysilicon (223), showed in FIG. 2B, are etched back to be left only in the interior of each of the gate trenches (221) respectively to form a plurality of gate oxide films (203) and a plurality of trenched gates (204) corresponding to the gate trenches (221) which act as gate regions of trenched MOSFET. It is noted here that, in a MOSFET chip structure, extraction of the gate electrode by the polysilicon (223) is required. A P-type base layer (205) is formed in the N-type epitaxial layer (202) by an ion implantation procedure, e.g. an implantation of B (boron) or BF2 (boron fluoride) ions, and a N+-type source layer (206) is formed on the P-type base layer (205) to the depth shallower than the gate trenches (221) by another ion implantation procedure, e.g. an implantation of As (arsenic) ions, and followed with source diffusion.

Figure 2D:
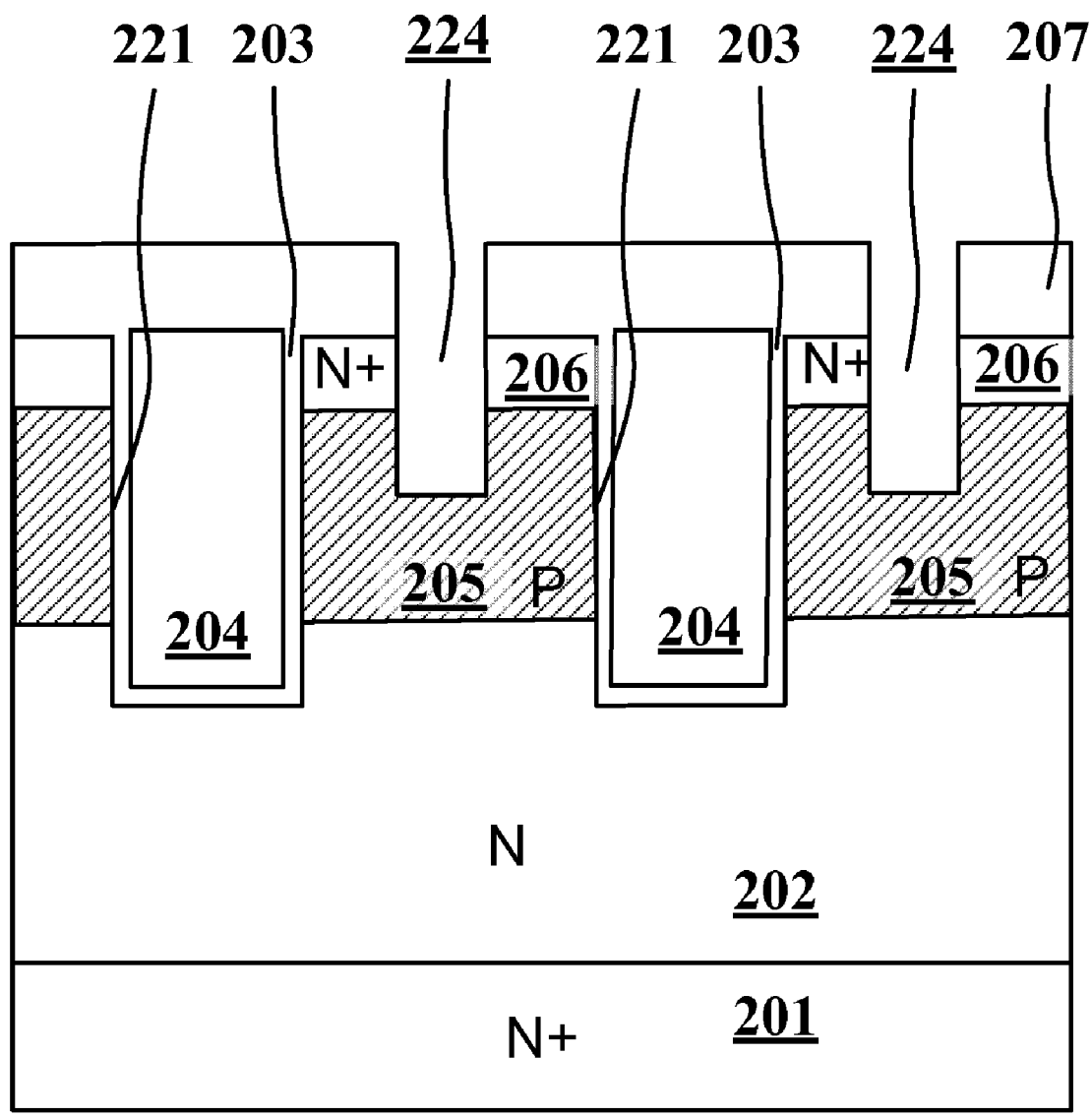

Referring to FIG. 2D, an interlayer oxide film (207) is deposited by CVD procedure. Thereafter, a patterning is carried out by photolithography and the interlayer oxide film (207) is etched by dry Oxide while the P-type base layer (205) and the N+-type source layer (206) are etched by silicon etching. The silicon etching is etched to the depth reaching the P-type base layer (205) through the interlayer oxide film (207) and the N+-type source layer (206), and a plurality of source contact trenches (224) are formed.

Figure 2E:
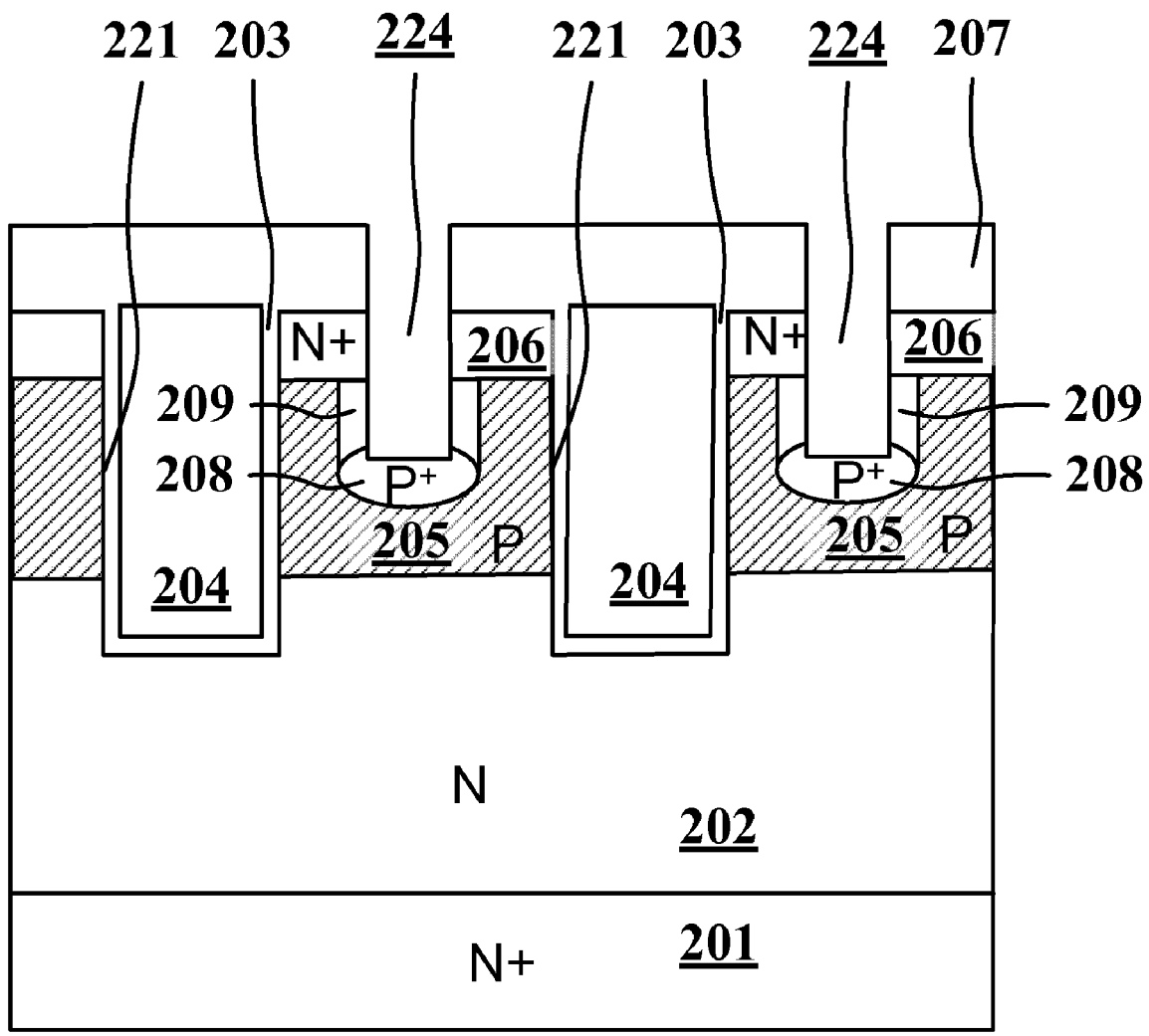
Figure 3A:
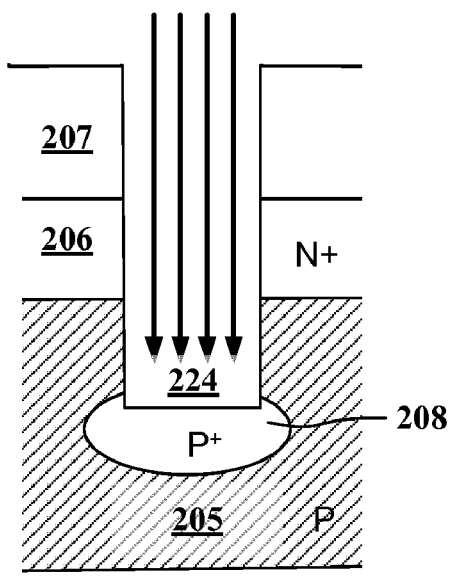
FIGS. 3A and 3B are schematic sectional views for describing ion implantation into a source contact trench of the present invention.
Figure 3B:
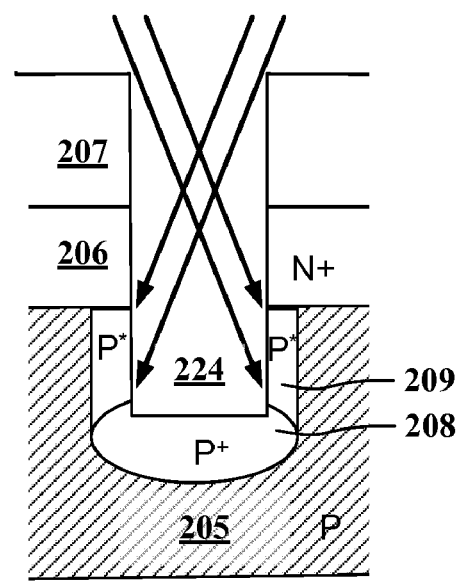

Referring to FIGS. 2E and 3A, an implantation procedure of BF2 with ninety degree (90°) respective to epitaxial layer surface and dose ranging from 5E14 to 5E15 cm−2 and an activation by heat treatment are carried out to form a P+-type base contact layer (208) under the bottom of the source contact trench (224). Referring to FIGS. 2E and 3B, thereafter, another implantation procedure of BF2 with angle ranging from 45 to 80 degree respective to the surface of the epitaxial layer (202) and dose ranging from 1E14 to 4E14 cm−2, and another activation by heat treatment are carried out to form a P*-type lateral contact layer (209) at the sidewall of the source contact trench (224) and corresponding to the P-type base layer (205) while the implantation angle of the implantation procedure respective to the surface of the epitaxial layer (202) is less than the implantation angle of the implantation procedure of the P+-type base contact layer (208). The said P*-type lateral contact layer (209) has less doping concentration than the P+-type base contact layer (208) while the implantation procedure parameters of the P+-type base contact layer (208) and the P*-type lateral contact layer (209) are considered. For example, the implantation procedure of the P+-type base contact layer (208) has higher doping concentration of BF2 (boron fluoride) than the P*-type lateral contact layer (209).

Figure 2F:
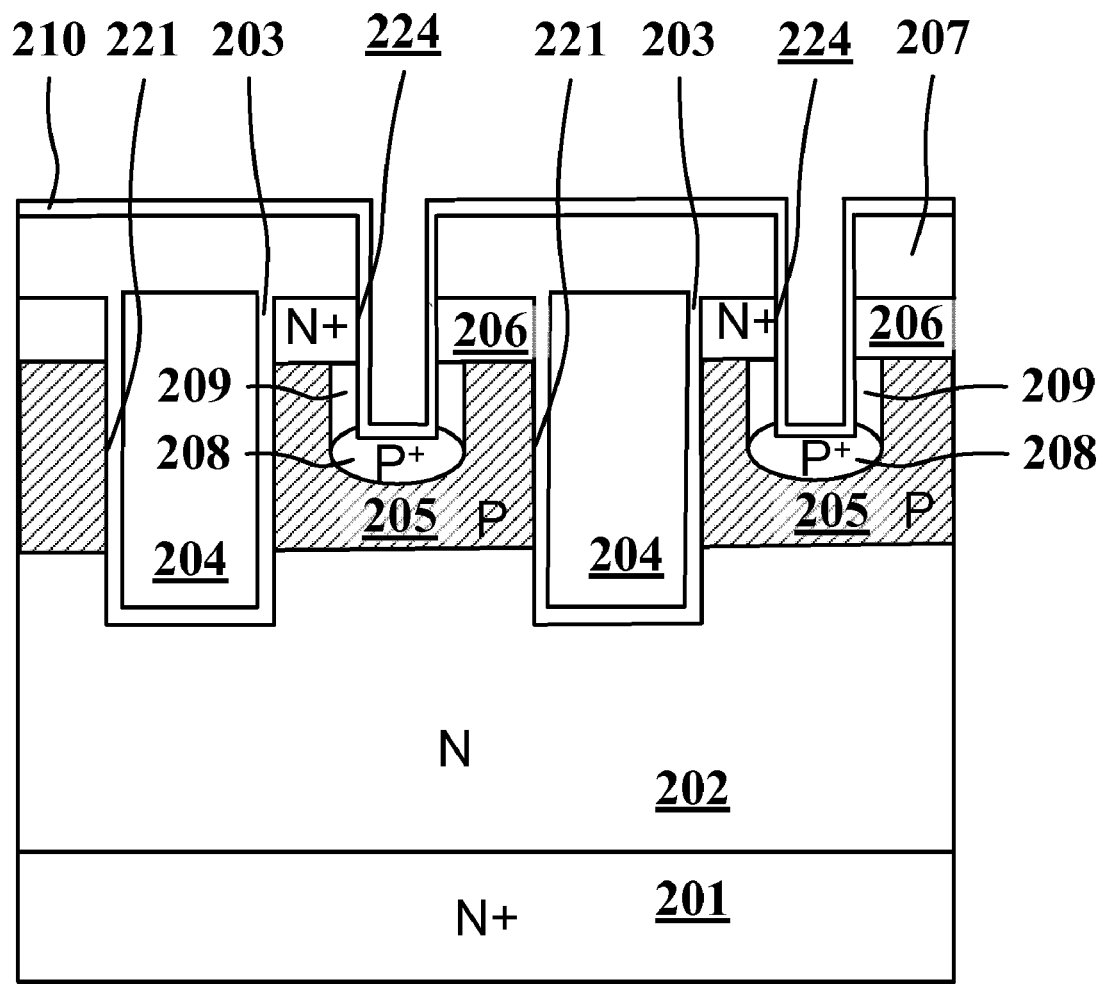

Referring to FIG. 2F, after the P+-type base contact layer (208) and the P*-type lateral contact layer (209) are formed, a barrier metal layer (210), which has ingredient selected from one of Ti (titanium), TiN (titanium nitride), or synthetic of Ti and TiN, is deposited by sputtering and is formed on the surface of the source contact trenches (224) and interlayer oxide film (207).

Figure 2G:
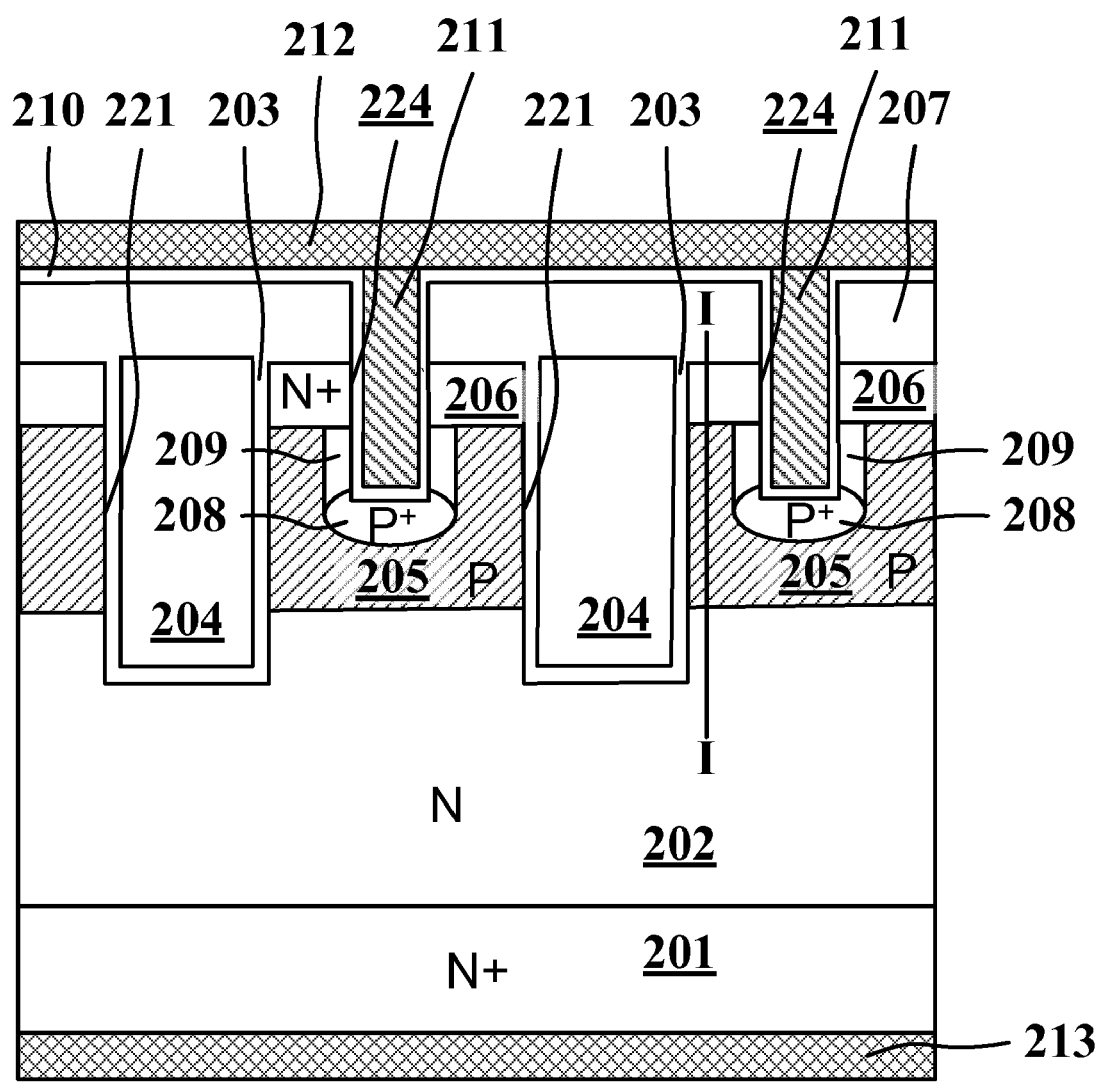

Referring to FIG. 2G, the source contact trenches (224) are filled with one metal or an electrically conductive material to form a plurality of contact metal plugs (211). The contact metal plugs (211) can be formed on the surface of the barrier metal layer (210) by depositing metal, which preferably is tungsten metal. After etch back of the contact metal plug (211), a front metal layer (212) is formed on the surfaces of the barrier metal layer (210) and the contact metal plugs (211) and is defined a region for metal connections of the trenched MOSFET. The contact metal plug (211) is deposited by CVD or one deposition procedure. Besides tungsten metal, the material of the contact metal plug (211) can although be selected from aluminum metal or copper metal, and so the front metal layer (212) of the trenched MOSFET is.

The said front metal layer (212) can also is deposited by sputtering AlSi (aluminum silicon) or AlSiCu (aluminum copper silicon) on the surface of the barrier metal layer (210). The front metal layer (212) is preferably as thick as possible in order to reduce the resistance component of AlSi or AlSiCu. In the MOSFET chip structure, the front metal layer (212) is used not only as a source electrode, one part of the front metal layer (212), but also as a gate electrode, another part of the front metal layer (212), connected to the polysilicon (223). Therefore, in an area except the cell region, patterning by photolithography and etching are required (not shown). Subsequently, a covering material such as PSG (phosphosilicate glass) or a nitride film is deposited as a surface protection film. In order to form a bonding region, patterning by photolithography and etching are carried out (not shown). Finally, the other surface of the N+-type silicon substrate (201) is ground by a desired thickness. Several kinds of metals are deposited by vapor deposition to form a back metal layer (213) as a drain electrode.

In the said embodiment, description has been directed to the N-channel MOSFET structure. However, by inverting the conductive type, this invention is also applicable to a P-channel MOSFET structure. Moreover, in the MOSFET of this invention, the trenches of the MOSFET are not restricted to have vertical shape but may be a tapered shape.

Referring to FIG. 2G again, the N+-type silicon substrate (201), the N-type epitaxial layer (202), the P-type base layer (205), and the N+-type source layer (206) construct the semiconductor region of the trenched MOSFET. The gate trench (221) is formed to reach the N-type epitaxial layer (202) through the N+-type source layer (206) and the P-type base layer (205), and is covered by the interlayer oxide film (207). The source contact trenches (224) is formed to reach the P-type base layer (205) through the interlayer oxide film (207) and the N+-type source layer (206), and is covered by the front metal layer (212). The N-type epitaxial layer (202) are corresponding to the drain region of the trenched MOSFET, the N-type trenched gates (204) are corresponding to the gate region of the trenched MOSFET, the N+-type source layer (206) are corresponding to the source region of the trenched MOSFET, and the P-type base layer (205) are corresponding to the body region of the trenched MOSFET. Furthermore, the front metal layer (212) is formed as the source metal, and the gate and field plate metal of the trenched MOSFET. The interlayer oxide film (207) is formed between the front metal layer (212) and the trenched gates (204) for insulating, and the contact metal plugs (211) are penetrated through the interlayer oxide film (207) and contacted with the front metal layer (212). The P$^+$-type base contact layer (208) and the P*-type lateral contact layer (209) are formed at the bottom and sidewall of the source contact trenches (224), respectively. The P*-type lateral contact layer (209) doping concentration is optimized to have ohmic contact to the barrier metal layer (210)/the contact metal plug (211) without significantly increasing threshold voltage of device, causing higher Rds.

Figure 4:
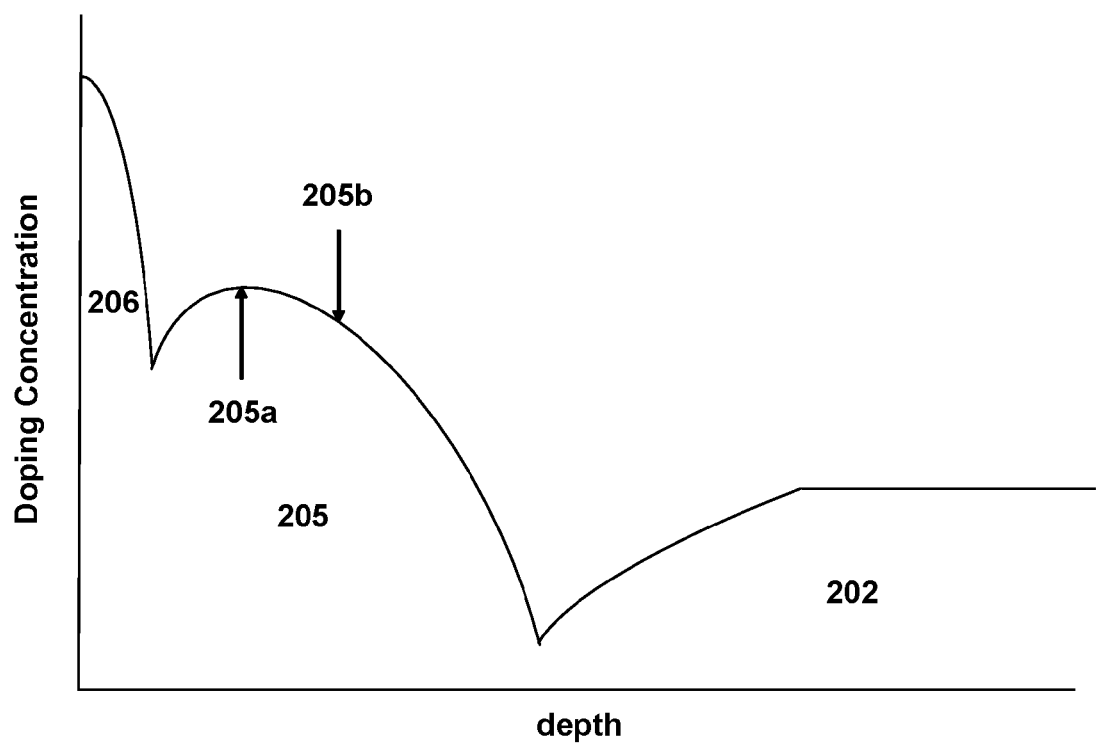
FIG. 4 shows an impurity concentration profile taken along a line I-I in FIG. 2G of the present invention.

Referring to FIG. 4, a depth from top surface of the N$^+$-type source layer (206) to the bottom of the source contact trenches (224) is preferably different from the peak depth in an impurity concentration profile of the P-type base layer (205) in FIG. 4 taken along the line I-I in FIG. 2G. That is, the peak depth is defined as a position having a maximum impurity-concentration depth (205a) which determinates Vth, in a depth direction of the P-type base layer (205). As described above, the depth of the contact trench bottom (205b) in the MOSFET is different from the maximum impurity-concentration depth (205a). Thus, it is possible to suppress the influence upon the channel region and to reduce the cell size without increasing threshold voltage.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A trenched MOSFET with trenched source contact, comprising:
   a semiconductor region having a drain region, a body region and a source region, comprising, a silicon substrate, an epitaxial layer corresponding to said drain region disposed on the top of said silicon substrate, a base layer corresponding to said body region disposed on the top of said epitaxial layer, and a source layer corresponding to said source region disposed on the top of said base layer;
   a front metal layer formed on the upper surface of said semiconductor region;
   an interlayer oxide film formed between said source layer and said front metal layer;
   a bottom metal layer formed on the lower surface of said semiconductor region;
   a plurality of trenched gates covered by said interlayer oxide film are formed on top of said source layer extending downwardly through said base layer to a portion of said epitaxial layer; and
   a plurality of source contact trenches formed on the top of said interlayer oxide film extending downwardly through said source layer to a portion of said base layer; wherein the sidewalls of said trenches in said base layer are covered by the lateral contact layer; wherein the bottom base of said trenches in said base layer are covered by the base contact layer.

2. The trenched MOSFET of claim 1, wherein the silicon substrate, the epitaxial layer, and the source layer are N-type; the base layer and lateral contact layer are P-type; and each of the source contact trenches further has a P-type base contact layer at a bottom thereof, and the lateral contact layer has less doping concentration than the base contact layer at bottom.

3. The trenched MOSFET of claim 2, wherein further comprises a barrier metal layer and a plurality of contact metal plugs.

4. The trenched MOSFET of claim 3, wherein the barrier metal layer is Ti/TiN and the contact metal plug is Tungsten.

5. The trenched MOSFET of claim 4, wherein the source contact trench is selected from one of a vertical shape and a tapered shape.

6. The trenched MOSFET of claim 1, wherein the silicon substrate, the epitaxial layer, and the source layer are P-type; the base layer and lateral contact layer are N-type; and each of the source contact trenches further has a N-type base contact layer at a bottom thereof, and the lateral contact layer has less doping concentration than the base contact layer at bottom.

7. The trenched MOSFET of claim 6, wherein further comprises a barrier metal layer and a plurality of contact metal plugs.

8. The trenched MOSFET of claim 7, wherein the barrier metal layer is Ti/TiN and the contact metal plug is Tungsten.

9. The trenched MOSFET of claim 8, wherein the source contact trench is selected from one of a vertical shape and a tapered shape.

* * * * *